United States Patent
Lim et al.

(10) Patent No.: US 7,989,877 B2
(45) Date of Patent: Aug. 2, 2011

(54) SEMICONDUCTOR DEVICES INCLUDING A DIELECTRIC LAYER

(75) Inventors: Jaesoon Lim, Seoul (KR); Kyuho Cho, Hwaseong-si (KR); Jaehyoung Choi, Hwaseong-si (KR); Younsoo Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 67 days.

(21) Appl. No.: 12/591,533

(22) Filed: Nov. 23, 2009

(65) Prior Publication Data

US 2010/0127319 A1 May 27, 2010

(30) Foreign Application Priority Data

Nov. 25, 2008 (KR) .................. 10-2008-0117490

(51) Int. Cl.
- *H01L 29/792* (2006.01)
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ........ 257/324; 257/325; 257/405; 257/406; 257/410; 257/411; 257/E29.162; 257/E29.163; 257/E29.164; 257/E29.165

(58) Field of Classification Search ................. 257/324, 257/325, 405, 406, 410, 411, E29.163, E29.164, 257/E29.165
See application file for complete search history.

(56) References Cited

U.S. PATENT DOCUMENTS

| | | | |
|---|---|---|---|
| 4,678,761 A * | 7/1987 | Virkar et al. ................. 501/104 |
| 5,954,930 A * | 9/1999 | Nafe et al. .................... 204/421 |
| 6,060,755 A | 5/2000 | Ma et al. |
| 6,297,539 B1 | 10/2001 | Ma et al. |
| 7,045,073 B2 * | 5/2006 | Hareland et al. ............... 216/87 |
| 7,132,336 B1 * | 11/2006 | Aronowitz et al. ........... 438/288 |
| 7,141,857 B2 * | 11/2006 | Yu et al. ........................ 257/405 |
| 7,172,947 B2 * | 2/2007 | Li et al. ......................... 438/396 |
| 7,183,604 B2 | 2/2007 | Cartier et al. |
| 7,217,643 B2 * | 5/2007 | Liang et al. ................... 438/591 |
| 7,728,376 B2 * | 6/2010 | Matsui et al. ................. 257/310 |
| 7,740,960 B1 * | 6/2010 | Zhu et al. ....................... 428/699 |
| 2007/0228427 A1 | 10/2007 | Matsui et al. |
| 2008/0203529 A1 * | 8/2008 | Kang et al. ................... 257/532 |
| 2008/0303119 A1 * | 12/2008 | Watanabe ..................... 257/632 |
| 2009/0085160 A1 * | 4/2009 | Lee et al. ...................... 257/532 |
| 2009/0278110 A1 * | 11/2009 | Gorer et al. ....................... 257/4 |

FOREIGN PATENT DOCUMENTS

| | | |
|---|---|---|
| JP | 2002-033320 A | 1/2002 |
| JP | 2004-161602 A | 6/2004 |
| JP | 2007-266474 A | 10/2007 |
| KR | 10-2002-0005432 A | 1/2002 |
| KR | 10-2007-0098504 A | 10/2007 |

* cited by examiner

*Primary Examiner* — Ida M Soward
(74) *Attorney, Agent, or Firm* — Lee & Morse, P.C.

(57) ABSTRACT

A semiconductor device includes a substrate and a doped hafnium oxide layer disposed on the substrate, the doped hafnium oxide layer including a hafnium oxide layer doped with doping atoms and having tetragonal unit lattices, an ion size of the doping atom being greater than an ion size of a hafnium atom.

10 Claims, 7 Drawing Sheets

Doped tetragonal unit lattice

Edge1=Edge2<Edge3

SEMICONDUCTOR DEVICES INCLUDING A DIELECTRIC LAYER

BACKGROUND

1. Field

Embodiments disclosed herein relate to semiconductor devices, and more particularly, to semiconductor devices including a dielectric layer.

2. Description of the Related Art

Semiconductor devices may be used in many electronic devices because they may provide multi-functionality, miniaturization and/or low power consumption. Semiconductor devices may include various material layers such as a semiconductor layer, a conductive layer and/or a dielectric layer. The dielectric layers may have various uses in semiconductor devices. For example, dielectric layers may be used in insulating an upper conductive layer from a lower conductive layer, as a gate dielectric layer of a MOS transistor, or as a capacitor dielectric layer. Based on the various uses of dielectric layers, semiconductor devices may require dielectric layers that have superior characteristics. Moreover, it may also be necessary to improve manufacturing process margins for the dielectric layers.

SUMMARY

Embodiments are therefore directed to semiconductor devices including a dielectric layer, which substantially overcome one or more of the problems due to the limitations and disadvantages of the related art.

It is therefore a feature of an embodiment to provide a semiconductor device including a dielectric layer that includes a doped hafnium oxide tetragonal phase crystalline structure.

At least one of the above and other features and advantages may be realized by providing a semiconductor device, including a substrate, and a doped hafnium oxide layer disposed on the substrate, the doped hafnium oxide layer including a hafnium oxide layer doped with doping atoms and having tetragonal unit lattices, an ion size of the doping atom being greater than an ion size of a hafnium atom.

The tetragonal unit lattices may include a doped tetragonal unit lattice, and the doped tetragonal unit lattice may include hafnium atoms, oxygen atoms and the doping atom substituted for a hafnium atom on at least one lattice point.

The tetragonal unit lattices may further include a pure tetragonal unit lattice consisting of hafnium atoms and oxygen atoms.

A dielectric constant of the doped hafnium oxide layer may be about 32 to about 50.

The semiconductor device may further include an undoped hafnium oxide layer disposed on the doped hafnium oxide layer, the undoped hafnium oxide layer being substantially free of the doping atoms.

The undoped hafnium oxide layer may include a pure tetragonal unit lattice consisting of hafnium atoms and oxygen atoms.

The doped atoms in the doped hafnium oxide layer may have content ratios of about 3% to about 15%.

The semiconductor device may further include an electrode disposed on the doped hafnium oxide layer.

The semiconductor device may further include a tunnel insulating layer disposed between the doped hafnium oxide layer and the substrate, and a charge storage layer disposed between the tunnel insulating layer and the doped hafnium oxide layer.

The semiconductor device may further include a lower electrode disposed between the doped hafnium oxide layer and the substrate.

At least one of the above and other features and advantages may also be realized by providing a method of forming a semiconductor device, the method including providing a substrate, and forming a doped hafnium oxide layer on the substrate, the doped hafnium oxide layer including a hafnium oxide layer doped with doping atoms and having tetragonal unit lattices, an ion size of the doping atom being greater than an ion size of a hafnium atom.

The tetragonal unit lattices may include a doped tetragonal unit lattice, and the doped tetragonal unit lattice may include hafnium atoms, oxygen atoms and the doping atom substituted for a hafnium atom on at least one lattice point.

The tetragonal unit lattices may further include a pure tetragonal unit lattice consisting of hafnium atoms and oxygen atoms.

A dielectric constant of the doped hafnium oxide layer may be about 32 to about 50.

The method may further include forming an undoped hafnium oxide layer disposed on the doped hafnium oxide layer, the undoped hafnium oxide layer being substantially free of the doping atoms.

Forming the undoped hafnium oxide layer may include an annealing process having a process temperature of about 300° C. to 600° C.

The doped atoms in the doped hafnium oxide layer may have content ratios of about 3% to about 15%.

Forming the doped hafnium oxide layer may include an annealing process having a process temperature of about 300° C. to 600° C.

Forming the doped hafnium oxide layer may include at least one hafnium-cycle and at least one doping material-cycle.

The number of hafnium-cycles may be less than or equal to quadruple the number of doping material-cycles.

BRIEF DESCRIPTION OF THE DRAWINGS

The above and other features and advantages of the embodiments will become more apparent to those of ordinary skill in the art by describing in detail exemplary embodiments thereof with reference to the attached drawings, in which.

DETAILED DESCRIPTION

Korean Patent Application No. 10-2008-0117490, filed on Nov. 25, 2008, in the Korean Intellectual Property Office, and entitled: "Semiconductor Devices Including a Dielectric Layer," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc., may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments may be described with reference to cross-sectional illustrations, which are schematic illustrations of idealized embodiments. As such, variations from the shapes of the illustrations, as a result, for example, of manufacturing techniques and/or tolerances, are to be expected. Thus, exemplary embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1A:
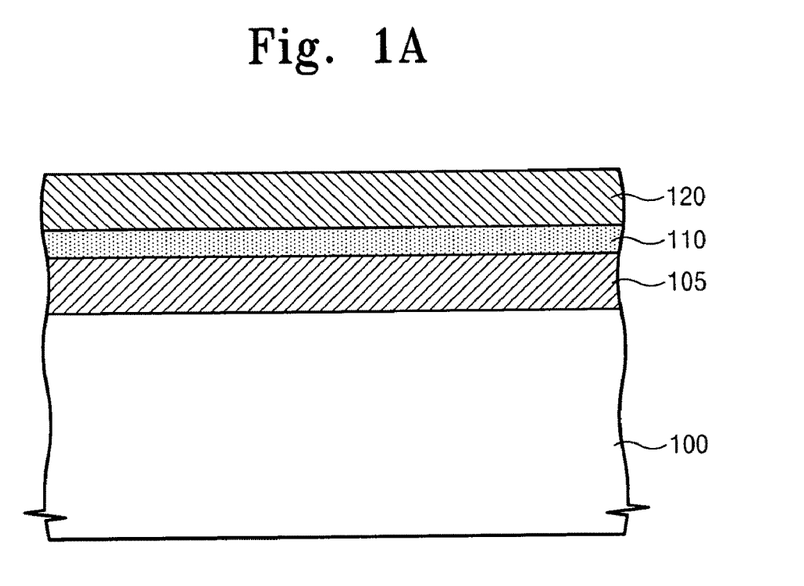
FIGS. 1A and 1B illustrate cross-sectional views of semiconductor devices according to embodiments.

FIG. 1A illustrates a cross-sectional view of a semiconductor device according to an exemplary embodiment. Referring to FIG. 1A, a doped hafnium oxide layer 110 may be disposed on a substrate 100. A lower electrode 105 may be disposed between the substrate 100 and the doped hafnium oxide layer 110. An upper electrode 120 may be disposed on the doped hafnium oxide layer 110. The lower electrode 105 and the upper electrode 120 may correspond to the two electrodes of a capacitor. The doped hafnium oxide layer 110 may be included as a dielectric layer of a capacitor. The substrate 100 may be a semiconductor substrate. An interlayer insulating layer (not shown) may be disposed between the substrate 100 and the lower electrode 105. The capacitor may be embodied in various shapes, e.g., a flat shape, a cylinder shape or a stack shape. The capacitor may be connected to a source/drain region of a capacitor transistor, e.g., in a DRAM memory device.

The doped hafnium oxide layer 110 may be formed of hafnium oxide doped by doping atoms. The doped hafnium oxide layer 110 may include doping atoms, hafnium atoms, and oxygen atoms. An ion size of the doping atom may be greater than an ion size of the hafnium atom. The ion size of the doping atom refers to a size of the doping atom being ionized, and the ion size of the hafnium atom refers to a size of the hafnium atom being ionized. The doping atoms having an ion size larger than the ion size of the hafnium atom include, e.g., strontium (Sr), cerium (Ce), and barium (Ba). The doping atoms may be used alone, or in combination.

The doped hafnium oxide layer 110 may be in a crystalline state or in a polycrystalline state. The doped hafnium oxide layer 110 may include tetragonal unit lattices. The tetragonal unit lattice includes three edges extending in an x axis, a y axis, and a z axis, respectively. Two edges among the three edges of the tetragonal unit lattices have the same length and the other edge has a length different from the two edges. For example, the other edge may have a length longer than the two edges.

The doped hafnium oxide layer 110 may include a pure tetragonal unit lattice and a doped tetragonal unit lattice. The pure tetragonal unit lattice may consist of hafnium atoms and oxygen atoms. Hafnium atoms in the pure tetragonal unit lattice may be disposed at lattice points, respectively. Lattice points of the pure tetragonal unit lattice include vertexes of the lattice and face-centers of the lattice. Oxygen atoms in the pure tetragonal unit lattice may be disposed in the lattice. For example, the oxygen atoms may be disposed in the center of the pure tetragonal unit lattice, and/or between adjacent hafnium atoms along a face of the lattice.

The doped tetragonal unit lattice may consist of hafnium atoms, oxygen atoms and at least one of the doping atoms. The hafnium atoms of the doped tetragonal unit lattice may be located at lattice points (i.e., vertexes and face-centers). Moreover, at least one doping atom of the doped tetragonal unit lattice may be disposed on one or more of the lattice points in the doped tetragonal unit lattice.

Figure 2A:
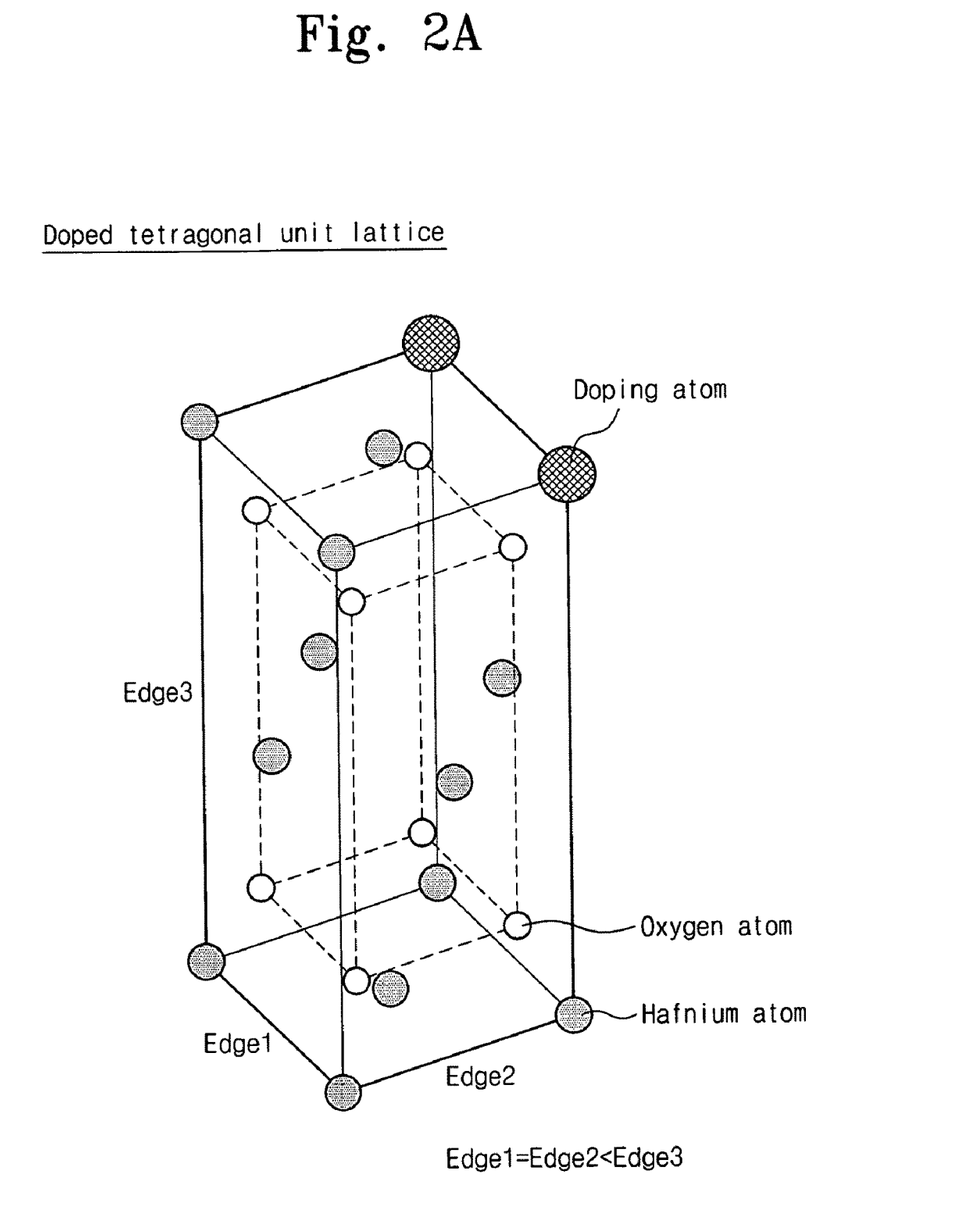
FIG. 2A illustrates a doped tetragonal unit lattice according to embodiments.
Figure 2B:
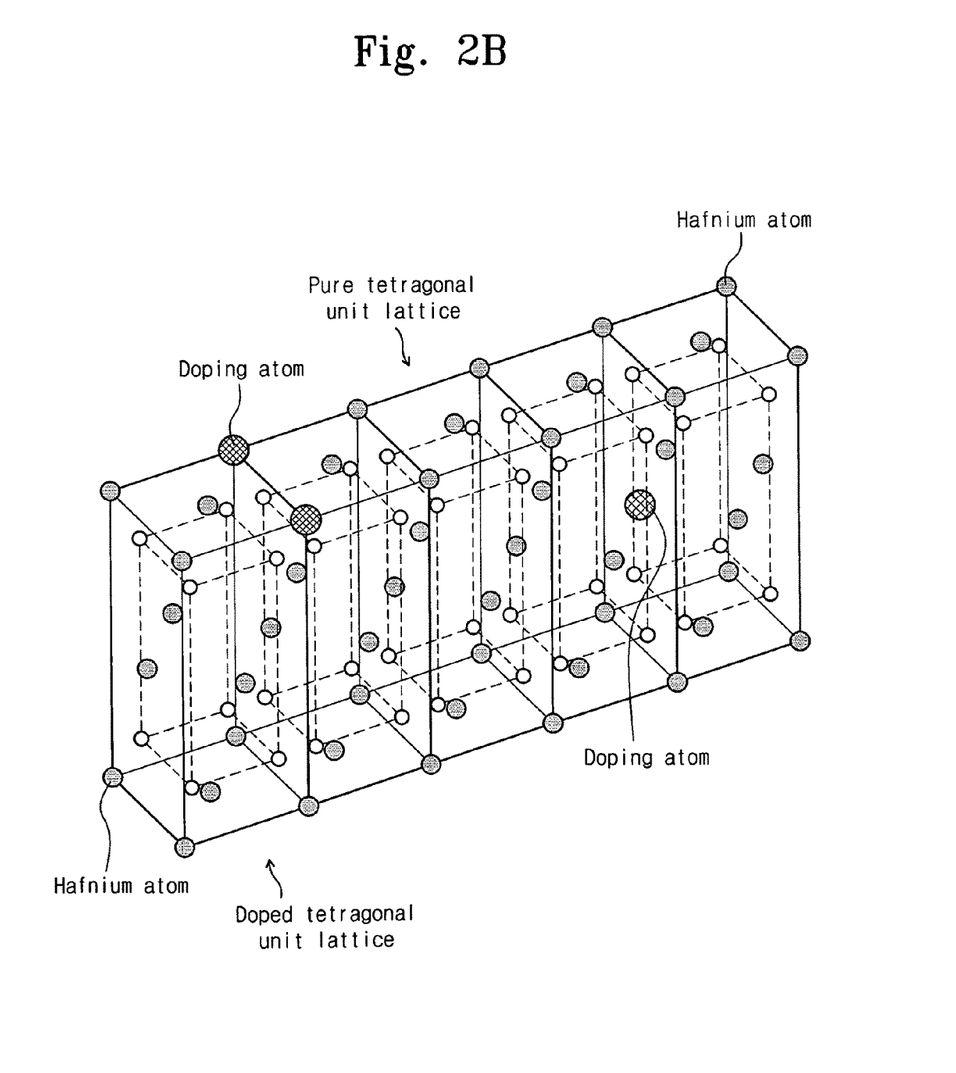
FIG. 2B illustrates a lattice structure of a portion of a doped hafnium oxide layer included in semiconductor devices according to embodiments.

In other words, the doped tetragonal unit lattice may be a type in which at least one of the hafnium atoms of the pure tetragonal unit lattice is substituted by the doping atom on at least one lattice point of the pure tetragonal unit lattice. Additionally, the oxygen atoms may be disposed in the doped tetragonal unit lattice. For example, the oxygen atoms may be disposed in the center of the pure tetragonal unit lattice, and/or between adjacent hafnium and/or doping atoms along a face of the lattice. The doped tetragonal unit lattice according to embodiments is illustrated in FIG. 2A. And lattice structure of a portion of the doped hafnium oxide layer 110 according to embodiments is illustrated in FIG. 2B.

The doped hafnium oxide layer 110 including the tetragonal unit lattice structure, i.e., including the doped tetragonal unit lattices with or without pure tetragonal unit lattices, may have a high dielectric constant. In particular, the doped hafnium oxide layer 110 may have a dielectric constant higher than about 30. The dielectric constant of the doped hafnium oxide layer 110 may be about 32 to about 50. The doping atoms in the doped hafnium oxide layer 110 may have a content ratio of about 3% to about 15%.

In contrast, a hafnium oxide layer in an amorphous state may have a dielectric constant of about 20. Further, a hafnium oxide layer having a cubic lattice of which three edges perpendicular to each other have the same length may have a dielectric constant higher than a hafnium oxide layer in an amorphous state, but lower than about 30. On the other hand, as discussed above, the doped hafnium oxide layer 110 according to an exemplary embodiment may include the tetragonal unit lattices and may have a dielectric constant higher than about 30.

A manufacturing process margin of the doped hafnium oxide layer 110 may be improved due to the ion size of the doping atom being greater than that of the hafnium atom. For instance, a processing temperature of forming the doped hafnium oxide layer 110 may be lowered. As such, thermal stress may also be reduced.

The lower electrode 105 may include one or more of metal nitride (for example, nitride titanium and nitride tantalum), noble metals (for example, ruthenium (Ru) and platinum (Pt)), metal-semiconductor compound (for example, tungsten silicide and titanium silicide), metal (for example, titanium, tantalum, tungsten, and copper), and a doped semiconductor in an amorphous state or a polycrystalline state. The lower electrode 105 and the upper electrode 120 may include the same or different materials.

An additional dielectric layer (not shown) may be disposed between the lower electrode 105 and the doped hafnium oxide layer 110 and/or between the upper electrode 120 and the hafnium oxide layer 110. The additional dielectric layer may include one or more of an insulating metal oxide layer (for example, an aluminum oxide layer and a lanthanum oxide layer), a metal oxynitride layer (for example, an aluminum oxynitride layer), a silicon oxide layer, a silicon oxynitride layer, and a silicon nitride layer.

A semiconductor device having the capacitor including the doped hafnium oxide layer 110 may be embodied in, e.g., a logic device, a memory device and/or a hybrid device (for example, a device including both a logic device and the memory device). For example, when the semiconductor device having the capacitor is embodied in a memory device, the capacitor including the doped hafnium oxide layer 110 may be used as a data storage element of unit cell.

Figure 1B:
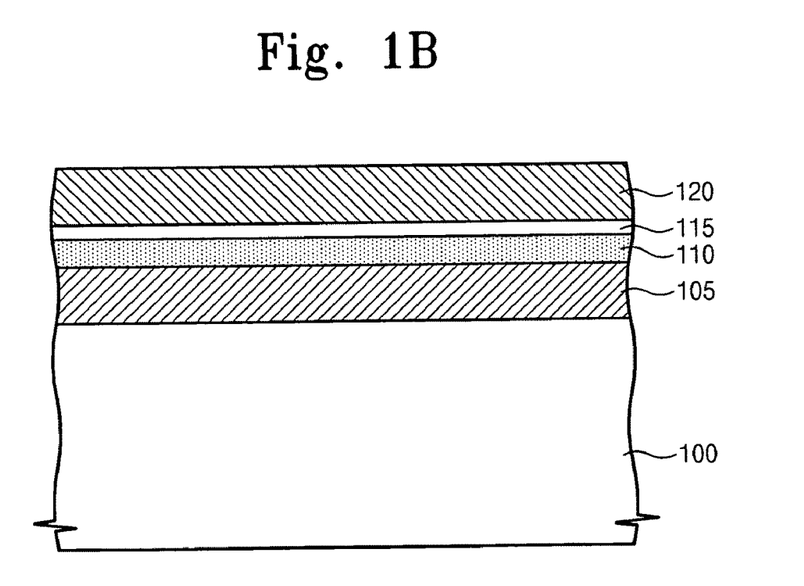

FIG. 1B illustrates a cross-sectional view of an exemplary embodiment of a semiconductor device. Elements in the exemplary embodiment that are similar to the elements described above in reference to FIG. 1A use the same reference numerals. The semiconductor device depicted in FIG. 1B may be embodied in, e.g., a logic device, a memory device and/or a hybrid device.

Referring to FIG. 1B, an undoped hafnium oxide layer 115 may be disposed between the doped hafnium oxide layer 110 and the upper electrode 120. The undoped hafnium oxide layer 115 may be in contact with a top surface of the doped hafnium oxide layer 110. The undoped hafnium oxide layer 115 may not include the doping atoms of the doped hafnium oxide layer 110. The undoped hafnium oxide layer 115 may consist of hafnium atoms and oxygen atoms. The undoped hafnium oxide layer 115 may be in a crystalline or a polycrystalline state.

The undoped hafnium oxide layer 115 may include a pure tetragonal unit lattice consisting of hafnium atoms and oxygen atoms. The undoped hafnium oxide layer 115 may not include the doped tetragonal unit lattice. The undoped hafnium oxide layer 115 may have a dielectric constant higher than 30 by including the pure tetragonal unit lattice structure. For example, a dielectric constant of the undoped hafnium oxide layer 115 may be about 32 to about 50.

In an exemplary embodiment, the undoped hafnium oxide layer 115 described above may be disposed between the doped hafnium oxide layer 110 and the upper electrode 120. Therefore, the undoped hafnium oxide layer 115 may be in contact with the top surface of the doped hafnium oxide layer 110.

Figure 3:
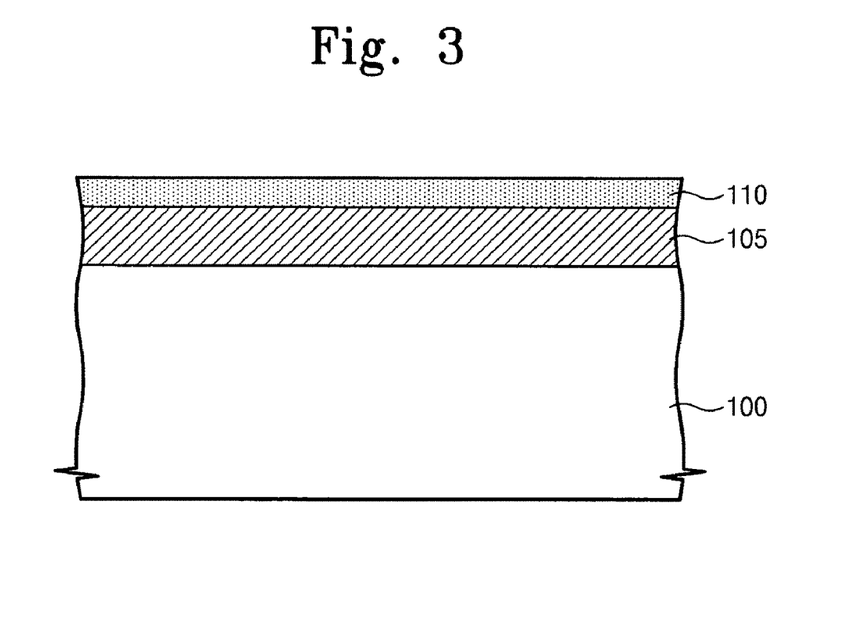
FIGS. 3 and 4 illustrate stages in a method of forming a semiconductor device according to an embodiment.
Figure 4:
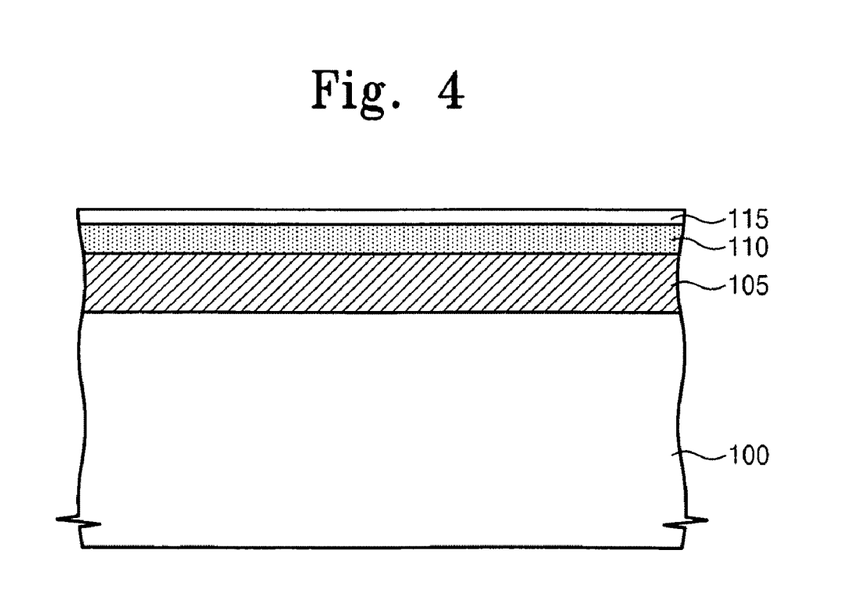

FIGS. 3 and 4 illustrate stages in a method of forming a semiconductor device according to an embodiment. Referring to FIG. 3, a lower electrode 105 may be formed on a substrate 100. The lower electrode 105 may be formed on an insulating layer formed on the substrate 100. The lower electrode 105 may be formed having various shapes, e.g., a flat shape, a cylinder shape or a stack shape.

The doped hafnium oxide layer 110 may be formed on the lower electrode 105. The doped hafnium oxide layer 110 may be formed by sequentially performing a deposition process and an annealing process. Further details about forming the doped hafnium oxide layer 110 are provided below.

A preliminary doped hafnium oxide layer including doping atoms, oxygen atoms and hafnium atoms may be deposited on the substrate 100 including the lower electrode 105. An ion size of the doping atom may be greater than an ion size of the hafnium atom. The doping atom may be, e.g., strontium (Sr), cerium (Ce), and/or barium (Ba). The preliminary doped hafnium oxide layer may be formed by, e.g., a first atomic layer deposition process using a hafnium source gas (hafnium atom precursor), a doping material source gas (doping atom precursor), and a reaction gas.

The hafnium source gas may include hafnium atoms and the doping material source gas may include the doping atoms. Moreover, the reaction gas may include oxygen atoms. For example, the reaction gas may include water vapor, ozone ($O_3$) gas, oxygen ($O_2$) gas, reactive oxygen gas, $N_2O$ gas, etc. A process temperature of the first atomic layer deposition process may be about 200° C. to about 300° C. A process pressure of the first atomic layer deposition process may be about 1 m Torr to about 10 Torr. The preliminary doped hafnium oxide layer may be deposited by at least one deposition-cycle. A thickness of the preliminary doped hafnium oxide layer may be controlled by the number of the deposition-cycles that are used.

The deposition-cycle for the preliminary doped hafnium oxide layer may include at least one hafnium-cycle and at least one doping material-cycle. The hafnium-cycle may include a supply of the hafnium source gas, a first purging, a supply of the reaction gas, and a second purging. The hafnium source gas may be supplied to a process chamber in which the substrate 100 is loaded to adsorb the hafnium source gas. The first purging may be performed after the hafnium source gas is supplied to the substrate 100 and the first purging may remove the hafnium source gas that was not adsorbed. Subsequently, the reaction gas may be supplied into the process chamber to react with the adsorbed hafnium source gas.

Moreover, the second purging may be performed after the reaction gas has been supplied to remove the reaction gas that has not reacted and/or unnecessary by-products. A purging gas used in the first purging and the second purging may be an inert gas (for example, argon gas).

The doping material-cycle may include a supply of the doping material source gas, a first purging, a supply of the reaction gas, and a second purging. More specifically, the doping material source gas may be supplied to the process chamber to be adsorbed by the substrate 100. The first purging in the doping material-cycle may be performed to remove the doping material source gas that was not adsorbed and/or unnecessary by-products. Subsequently, the reaction gas of the doping material-cycle may be supplied to the process chamber to react with the adsorbed doping material source gas. Moreover, the second purging of the doping material-cycle may be performed to remove the reaction gas that has not reacted and/or unnecessary by-products. A purging gas used in the first purging and the second purging of the doping material-cycle may be an inert gas. The purging gases of the doping material-cycle may be the same as, or different from, the purging gases of the hafnium-cycle. The number of times the reaction gas is supplied during the deposition-cycle, which includes the hafnium-cycle and the doping material-cycle, may be the same as the sum of the number of times the hafnium source gas is supplied and the number of times the doping material source gas is supplied.

Content ratios of the doping atoms in the preliminary doped hafnium oxide layer may be controlled by controlling the number of times the hafnium-cycle and the number of times the doping material-cycle are performed during the deposition-cycle. For example, when one hafnium-cycle and one doping material-cycle are performed, the content ratio of the doping atoms in the preliminary doped hafnium oxide layer may be about 15%. Moreover, when four hafnium-cycles and one doping material-cycle are performed, the content ratio of the doping atoms in the preliminary doped hafnium oxide layer may be about 3%. Therefore, as the number of hafnium-cycles is increased, with the number of doping material cycles being kept constant, the content ratio of the doping atoms in the preliminary doped hafnium oxide layer may decrease.

The number of the hafnium-cycles in the deposition-cycle may be equal to or greater than the number of the doping material-cycles. For example, the number of hafnium-cycles in the deposition-cycle may be equal to or less than quadruple the number of doping material-cycles.

The doping material-cycle may be performed after completing the required number of the hafnium-cycles in the deposition-cycles. Alternatively, at least one hafnium-cycle may be performed after completing the required number of the doping material-cycles in the deposition-cycles. In another implementation, the doping material-cycle may be performed between the hafnium-cycles in the deposition-cycle.

According to an exemplary embodiment, the preliminary hafnium oxide layer may be formed by at least one deposition-cycle that includes a one time of supply of the hafnium source gas, a one time of supply of the doping material source gas, and a one time of supply of the reaction gas. For example, the deposition-cycle may include a supply of a first source gas, a first purging, a supply of a second source gas, a second purging, a supply of a reaction gas and a third purging. The first source gas or the second source gas may be the hafnium source gas, and the other may be the doping material source gas. Therefore, the hafnium source gas or the doping material source gas may be supplied as the first source gas.

In the case where the first source gas is a hafnium source gas and the second source gas is a doping material source gas, the hafnium source gas may be supplied to the process chamber to adsorb to the substrate 100. Moreover, the first purging may be performed to remove the hafnium source gas that is not adsorbed. Subsequently, the doping material source gas may be supplied to the process chamber. The supplied doping material source gas may react with the adsorbed hafnium source gas or may adsorb to the substrate 100. Subsequently, the second purging may be performed to remove the doping material source gas that has not reacted and/or unnecessary by-products.

Thereafter, the reaction gas may be supplied to the process chamber. The supplied reaction gas may react with the adsorbed hafnium and doping material source gases, or may react with a reaction product of the hafnium and the doping material source gases. A third purging may be performed to remove the reaction gas that has not reacted and/or unnecessary by-products.

The first purging between a supply of the first source gas and a supply of the second source gas may be omitted. In this case, the first and second source gases may be sequentially or simultaneously supplied. In the deposition-cycle according to this exemplary embodiment, content ratios of the doping atoms in the preliminary doped hafnium oxide layer may be controlled by controlling the amount of inflow of the doping material source gas.

The preliminary doped hafnium oxide layer may be in a crystalline state having a monoclinic unit lattice and/or an amorphous state. An annealing process may be performed on the preliminary doped hafnium oxide layer to form the doped hafnium oxide layer 110. The doped hafnium oxide layer 110 may have a crystalline state including tetragonal unit lattices as a result of the annealing process. A process temperature of the annealing process may be decreased because of the doping atoms. Specifically, the doping atom may have a larger ion size compared to the hafnium atom. Thus, when the annealing process is performed, unit lattices formed in the preliminary doped hafnium oxide layer may be more easily extended in a specific direction based on the doping atom having a large size. As a result, a process temperature of the annealing process for forming doped hafnium oxide layer may be decreased.

A conventional hafnium oxide layer, i.e., not doped with the doping atoms, may have tetragonal unit lattices as a result of an annealing process at a high temperature of about 1000° C. or greater. In contrast, the doped hafnium oxide layer 110 according to the exemplary embodiments may be sufficiently formed having a crystalline state including the tetragonal unit lattices following an annealing process using a process temperature of about 600° C. or less.

The process temperature of the annealing process may be higher than a deposition temperature of the preliminary doped hafnium oxide layer and equal to or lower than about 600° C. For example, a process temperature of the annealing process may have a range of higher than about 300° C. and equal to or lower than about 600° C. The annealing process may be a rapid annealing process.

A doped tetragonal unit lattice, which is formed by substituting the doping atom for a hafnium atom in at least one lattice point, may be formed in the doped hafnium oxide layer 110 as a result of the annealing process. The doped tetragonal unit lattice may be similar to that described above in reference to FIG. 1A.

A pure tetragonal unit lattice consisting of hafnium atoms and oxygen atoms may be formed in the doped hafnium oxide layer 110 as a result of the annealing process. The pure tetragonal unit lattice may be formed at a low temperature by the adjacent doped tetragonal unit lattice. Consequently, the doped tetragonal unit lattice and the pure tetragonal unit lattice may both be formed in the doped hafnium oxide layer 110 following the annealing process of a low process temperature.

As described above, a process temperature of the annealing process may be lowered due to the larger ion size of the doping atoms. Moreover, a thermal stress of a semiconductor device may also be reduced. Thus, a manufacturing process margin (e.g., a temperature process margin) of the doped hafnium oxide layer 110 may be sufficiently obtained.

Referring to FIG. 1A, the semiconductor device may be embodied after the upper electrode 120 is formed on the doped hafnium oxide layer 110. Moreover, referring to FIG. 1B, the method of forming the semiconductor device may include forming the lower electrode 105, forming the doped hafnium oxide layer 110, forming the undoped hafnium oxide layer 115, and forming the upper electrode 120. Referring to FIGS. 3 and 4, the undoped hafnium oxide layer 115 may be formed on the doped hafnium oxide layer 110. The undoped hafnium oxide layer 115 may be in contact with the doped hafnium oxide layer 110. Moreover, the undoped hafnium oxide layer 115 may be formed by a deposition process and an annealing process.

According to an exemplary embodiment, in order to form the undoped hafnium oxide layer 115, a preliminary undoped hafnium oxide layer may be deposited on the doped hafnium oxide layer 110 by a second deposition-cycle using a hafnium source gas including hafnium atoms and a reaction gas including oxygen atoms. The second deposition-cycle may not use the doping material source gas, such that the preliminary undoped hafnium oxide layer does not include the doping atoms.

The second deposition-cycle for forming the preliminary undoped hafnium oxide layer may include a supplying a hafnium source gas, a first purging, supplying a reaction gas, and a second purging. A thickness of the preliminary undoped hafnium oxide layer may be controlled by the number of the second-deposition cycles that are used.

To form the undoped hafnium oxide layer 115, an annealing process may be performed on the substrate 100 having the preliminary undoped hafnium oxide layer. The preliminary undoped hafnium oxide layer may be directly formed on the doped hafnium oxide layer 110, allowing for a lower annealing process temperature. A pure tetragonal unit lattice consisting of hafnium atoms and oxygen atoms may be formed in the undoped hafnium oxide layer 115 following the annealing process. Thus, following the annealing process at a low temperature, a pure tetragonal unit lattice may be formed in the undoped hafnium oxide layer 115 due to the interaction with the tetragonal unit lattices in the doped hafnium oxide layer 110. A process temperature of the annealing process may be higher than a deposition temperature of the preliminary undoped hafnium oxide layer and equal to or lower than about 600° C. The annealing process may be a rapid annealing process.

Referring to FIG. 1B, the semiconductor device may include an upper electrode 120 formed on the undoped hafnium oxide layer 115. Thus, the semiconductor device may include the substrate 100, the lower electrode 105, the doped hafnium oxide layer 110, the undoped hafnium oxide layer 115, and the upper electrode 120.

An experiment was performed to check a characteristic of a doped hafnium oxide layer according to exemplary embodiments. A sample 1 and a sample 2 were prepared to perform the experiment. Sample 1 had a first capacitor including a lower electrode of nitride titanium, a first doped hafnium oxide layer, and an upper electrode of nitride titanium that were sequentially stacked. Sample 2 had a second capacitor including a lower electrode of nitride titanium, a second doped hafnium oxide layer, and an upper electrode of nitride titanium that were sequentially stacked. The lower electrodes of the first and second capacitors were formed to have the same thickness and the upper electrodes of the first and second capacitors were formed to have the same thickness. The doping atoms of the first doped hafnium oxide layer in the sample 1 and the second doped hafnium oxide layer in the sample 2 used strontium (Sr) atoms.

The first doped hafnium oxide layer was formed by performing a deposition-cycle and a rapid annealing process of 550° C. In the deposition-cycle for the first doped hafnium oxide layer, three hafnium-cycles and one strontium-cycle was performed. A thickness of the first doped hafnium oxide layer was measured to be about 56 Å. The second hafnium oxide layer was formed by performing a deposition-cycle using three hafnium-cycles and one strontium-cycle and a rapid annealing process of 550° C., i.e., the same as for the first doped hafnium oxide layer. The number of the deposition-cycles used for forming the second doped hafnium oxide layer was larger than the number of the deposition-cycles used for forming first doped hafnium oxide layer. Thus, a thickness of the second doped hafnium oxide layer was measured to be about 76 Å. In other words, the first and second doped hafnium oxide layers were formed under the same process condition and formed to have different thicknesses. The content ratio for the strontium atoms of the first and second doped hafnium oxide layers was about 7%.

Figure 5:
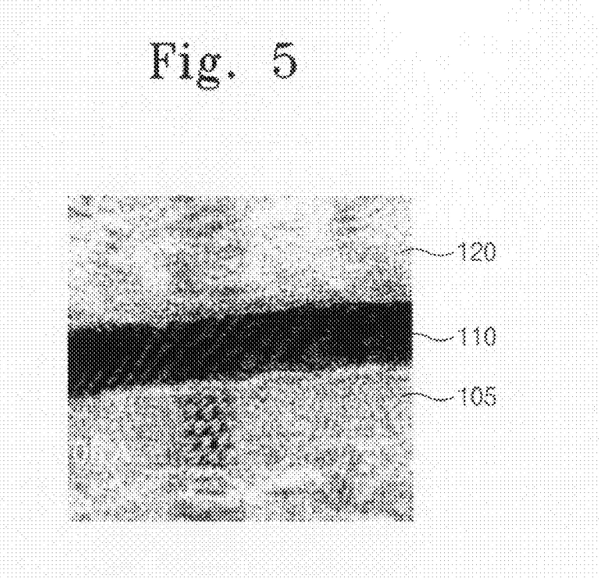
FIG. 5 illustrates a transmission electron micrograph (TEM) of a doped hafnium oxide layer of a semiconductor device according to an embodiment.

FIG. 5 illustrates a transmission electron micrograph (TEM) of the sample 1. Referring to FIG. 5, sample 1 includes a lower electrode 105 formed of nitride titanium, the first doped hafnium oxide layer 110, and an upper electrode 120 formed of nitride titanium. As shown in FIG. 5, the first doped hafnium oxide layer of the sample 1 was in a crystalline state.

A dielectric constant of a doped hafnium oxide layer with a strontium content ratio of 7% and annealed at a temperature of 550° C. was estimated using samples 1 and 2. The dielectric constants of both samples 1 and 2 was estimated so as to exclude a change of a dielectric constant due to a natural oxide layer on the nitride titanium lower electrode and/or a natural oxide layer on the first and second doped hafnium oxide layers. An electrostatic capacity of the first capacitor of the sample 1 was measured, and a first equivalent oxide layer thickness of about 7.8 Å was estimated for sample 1. Similarly, a second equivalent oxide layer thickness of about 10 Å was estimated for sample 2 from an electrostatic capacity of the second capacitor of sample 2. A pure dielectric constant of the first and second doped hafnium oxide layers may be estimated using a ratio of a difference between the first and second equivalent oxide layer thicknesses to a difference between physical thicknesses of the first and second doped hafnium oxide layers. A dielectric constant (c) of the first and second doped hafnium oxide layers was estimated using the following mathematical formula.

$$\text{Dielectric constant}(\in) = \in_0 \times \text{physical thickness difference/equivalent oxide layer thickness difference} \quad \text{[mathematical formula 1]}$$

Here, $\in_0$ is a dielectric constant of a silicon oxide layer, which may be about 3.9. The physical thickness difference represents a difference between a physical thickness of the second doped hafnium oxide layer (about 76 Å) and a physical thickness of the first doped hafnium oxide layer (about 56 Å). The equivalent oxide layer thickness difference represents a difference between the second equivalent oxide layer thickness (about 10 Å) and the first equivalent oxide layer thickness (about 7.8 Å).

Based on the above calculation, dielectric constants ($\in$) of the first and second doped hafnium oxide layers were about 35. Consequently, the first and second doped hafnium oxide layers, which were formed to be in a crystalline state, had a dielectric constant of greater than 30. Thus, it may be appreciated that the first and second doped hafnium oxide layers included tetragonal unit lattices.

A semiconductor device including a MOS transistor may be formed according to an exemplary embodiment. A gate insulating layer of the MOS transistor may include hafnium oxide layers according to exemplary embodiments discussed above. The semiconductor device including the MOS transistor may be embodied in, e.g., a logic device, a memory device and/or a hybrid device.

Figure 6:
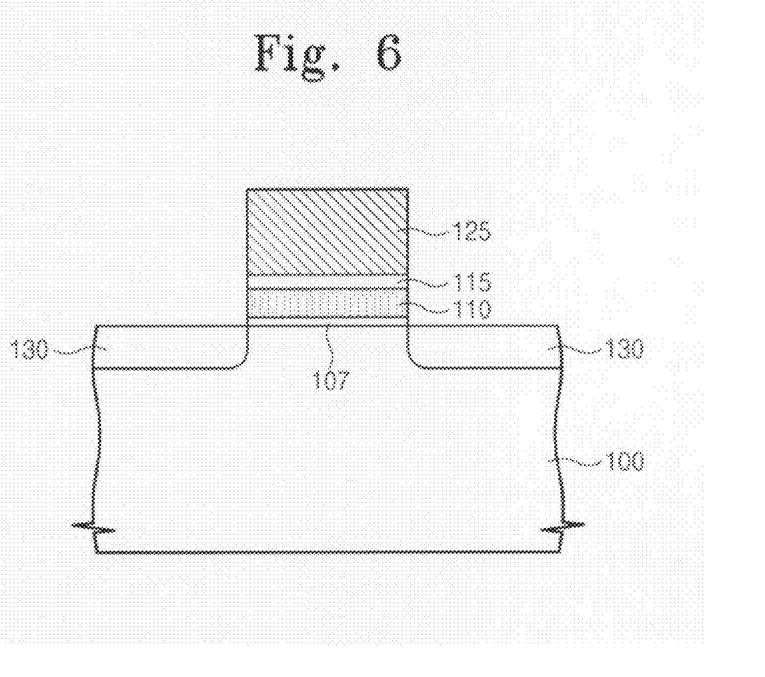
FIGS. 6 and 7 illustrate cross-sectional views of semiconductor devices according to embodiments.

FIG. 6 illustrates a cross-sectional view of a semiconductor device according to an exemplary embodiment. Referring to FIG. 6, an electrode 125 may be disposed on the substrate 100, and the doped hafnium oxide layer 110 may be disposed between the electrode 125 and the substrate 100. The electrode 125 may correspond to a gate electrode of the MOS transistor. The electrode 125 may include one or more of a doped semiconductor, metal (for example, titanium, tantalum, tungsten, and copper), metal-semiconductor compound (for example, metal silicide, metal-germanium compound, and metal germanosilicide), and/or conductive metal nitride (for example, nitride titanium, nitride tantalum, and nitride tungsten).

The doped hafnium oxide layer 110 may be included in a gate insulating layer of the MOS transistor. An undoped hafnium oxide layer 115 may be disposed between the doped hafnium oxide layer 110 and the electrode 125. The undoped hafnium oxide layer 115 may be in direct contact with a top surface of the doped hafnium oxide layer 110. Alternatively, the undoped hafnium oxide layer 115 may be omitted from the MOS transistor. Descriptions about characteristics and exemplary methods for forming the doped and undoped hafnium oxide layers 110 and 115 were described above.

An interface layer 107 may be disposed between the doped hafnium oxide layer 110 and the substrate 100. The interface layer 107 may perform a function of minimizing a reaction of the doped hafnium oxide layer 110 with the substrate 100. The interface layer 107 may include one or more of an oxide layer, a nitride layer, an oxynitride layer, and/or a metal silicate layer. The interface layer 107, the doped hafnium oxide layer 110, and the undoped hafnium oxide layer 115 between the electrode 125 and the substrate 100 may correspond to a gate insulating layer of the MOS transistor. Source/drain 130 may be disposed in the substrate 100 at both sides of the electrode 125. The electrode 125, the gate insulating layer and the source/drain 130 may constitute the MOS transistor.

A semiconductor device having a nonvolatile memory cell may be formed according to an exemplary embodiment. The nonvolatile memory cell may include a doped hafnium oxide layer. Elements in this embodiment similar to the elements in exemplary embodiments described above use the same reference numerals.

Figure 7:
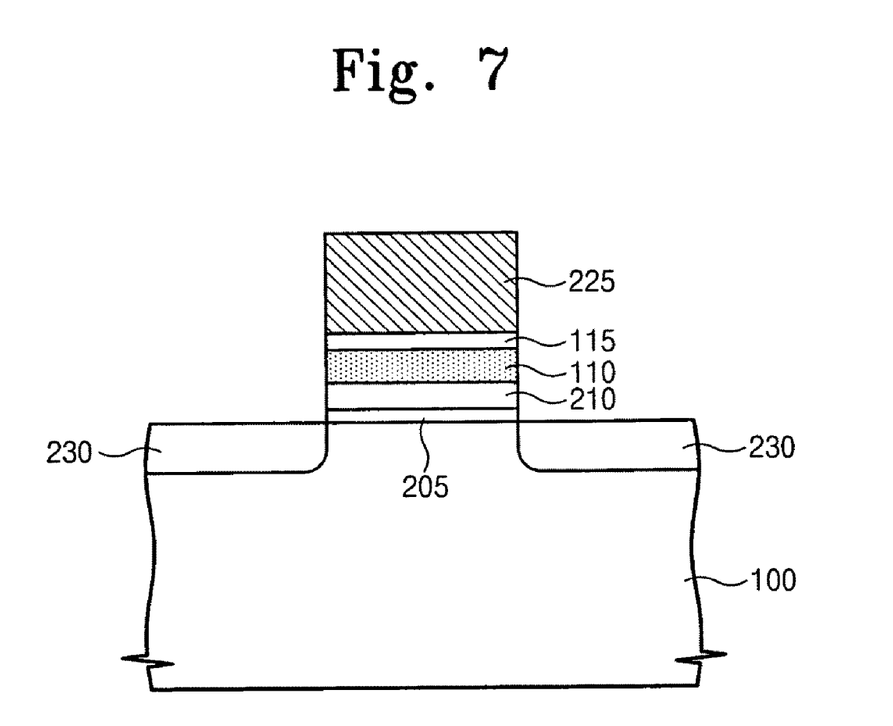

FIG. 7 illustrates a cross-sectional view of a semiconductor device according to an exemplary embodiment. Referring to FIG. 7, an electrode 225 may be disposed on the substrate 100. A charge storage layer 210 may be disposed between the electrode 225 and the substrate 100. The electrode 225 may include, e.g., a doped semiconductor, a metal (for example, titanium, tantalum, tungsten, and copper), a metal-semiconductor compound (for example, metal silicide, metal-germanium compound, and metal germanosilicide), and/or a conductive metal nitride (for example, nitride titanium, nitride tantalum, and nitride tungsten). The charge storage layer 210 may include a trap insulating layer including traps that store charges. For example, the charge storage layer 210 may include insulating layers including a nitride layer, an insulating metal nitride layer, and/or nano dots. The nano dots may be formed of a semiconductor and/or metal. Also, the charge storage layer 210 may include a conductor (for example, a doped semiconductor, metal, or metal compound) that may be electrically isolated.

A tunnel insulating layer 205 may be disposed between the charge storage layer 210 and the substrate 100. The tunnel insulating layer 205 may include at least one selected from an oxide layer and an oxynitride layer. The tunnel insulating layer 205 may be formed by, e.g., a thermal oxidation process and/or a nitride process. A doped hafnium oxide layer 110 may be disposed between the charge storage layer 210 and the electrode 225. The doped hafnium oxide layer 110 may be included in a blocking insulating layer disposed between the electrode 225 and the charge storage layer 210. The doped hafnium oxide layer 110 may perform a function of minimizing an emission of charges stored in the charge storage layer 210 to the electrode 225.

An undoped hafnium oxide layer 115 may be disposed between the doped hafnium oxide layer 110 and the electrode 225. The undoped hafnium oxide layer 115 may be in direct contact with the upper side of the doped hafnium oxide layer 110. The undoped hafnium oxide layer 115 may be included in the blocking insulating layer. Alternatively, the undoped hafnium oxide layer 115 may be omitted from the blocking insulating layer.

The blocking insulating layer may further include a dielectric layer disposed between the doped hafnium oxide layer 110 and the charge storage layer 210, and/or a dielectric layer disposed between the doped hafnium oxide layer 110 and the electrode 225. Descriptions about characteristics and exemplary methods for forming the doped and undoped hafnium oxide layers 110 and 115 were described above.

Source/drain 230 may be disposed in the substrate 100 at both sides of the electrode 225. The source/drain 230 may be a region doped with n-type dopants or p-type dopants. Alternatively, the source/drain 230 may be an inversion layer formed by a fringing electric field generated from the electrode 225 when the nonvolatile memory cell is operated.

The nonvolatile memory cell may include the electrode 225, the blocking insulating layer that may include at least the doped hafnium oxide layer 110, the charge storage layer 210, the tunnel insulating layer 205, and the source/drain 230. The semiconductor device including the nonvolatile memory cell illustrated in FIG. 7 may be embodied in, e.g., a NOR-type nonvolatile memory device or a NAND-type nonvolatile memory device.

Figure 8:
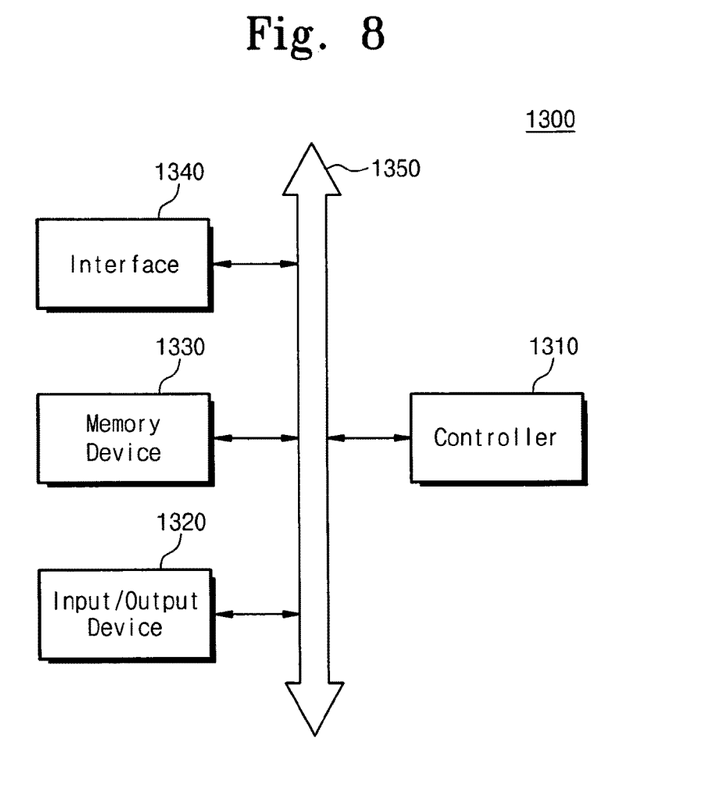
FIG. 8 illustrates a block diagram of an electronic system including a semiconductor device according to embodiments.

An electronic system including semiconductor devices may be formed according to an exemplary embodiment. FIG. 8 illustrates a block diagram of an electronic system including a semiconductor device according to an exemplary embodiment.

Referring to FIG. 8, an electronic system 1300 may include a controller 1310, an input/output device 1320, and a memory device 1330 that may be connected to each other via a bus 1350. The bus 1350 may correspond to a path through which data pass. The controller 1310 may include, e.g., a microprocessor, a digital signal processor, a microcontroller, a logic device that may perform a function similar to microprocessor/digital signal processor/microcontroller, etc. The semiconductor devices as illustrated in FIGS. 1, 2, and 6 may be embodied in a logic device required by the controller 1310. In this case, the controller 1310 may one or more of the semiconductor devices as illustrated in FIGS. 1, 2, and 6.

The input/output device 1320 may include various devices for inputting/outputting, e.g., a keypad, a keyboard, and a display device. The memory device 1330 may be a device for storing data. The memory device 1330 may store data and/or commands executed by the controller 1310. The semiconductor devices illustrated in FIGS. 1, 2, 6, and 7 may be embodied in memory devices required by the memory device 1330. In this case, one or more of the semiconductor devices illustrated in FIGS. 1, 2, 6, and 7 may be included in the memory device 1330.

The electronic system 1300 may further include an interface 1340 for transmitting data to a communication network or receiving from a communication network. The interface 1340 may be, e.g., a wired-type or a wireless-type, and it may be connected to the memory device 1330, the input/output device 1320, and the controller 1310 via the bus 1350. For example, the interface 1340 may include an antenna, a wired transceiver or a wireless transceiver.

The electronic system 1300 may be embodied in, e.g., a mobile system, a personal computer, an industrial computer, a system performing various functions, etc. Moreover, the mobile system may be, e.g., a personal digital assistant (PDA), a portable computer, a web tablet, a mobile phone, a wireless phone, a laptop computer, a memory card, a digital music system, a data transmission/receipt system, etc. In a case that the electronic system 1300 is an equipment that is capable of performing wireless communication, the electronic system 1300 may be used in a communication interface protocol of a third generation communication system such as CDMA, GSM, NADC, E-TDMA, WCDMA, CDMA2000, etc.

Figure 9:
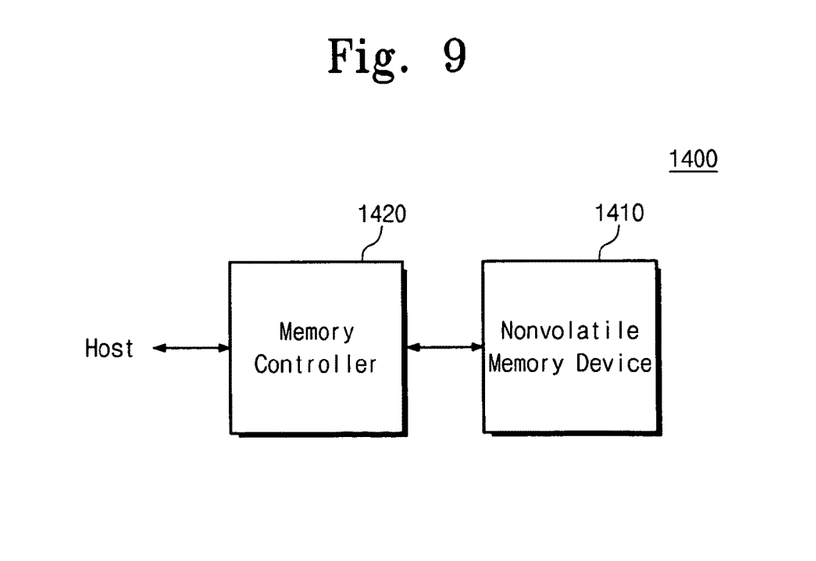
FIG. 9 illustrates a block diagram of a memory card including a semiconductor device according to embodiments.

A memory card including a semiconductor device may be formed according to an exemplary embodiment. FIG. 9 illustrates a block diagram of a memory card that may include a semiconductor device according to an exemplary embodiment.

Referring to FIG. 9, the memory card may include a nonvolatile memory device 1410 and a memory controller 1420. The nonvolatile memory device 1410 may store data or decode the stored data. The nonvolatile memory device 1410 may include the semiconductor device illustrated in FIG. 7. The memory controller 1420 may control the nonvolatile memory device so as to readout the stored data or store data in response to a request of decode/write of a host. The semiconductor devices illustrated in FIGS. 1, 2, and 6 may be embodied in logic devices required by the memory controller 1420. In this case, at least one of the semiconductor devices illustrated in FIGS. 1, 2, and 6 may be included in the memory controller 1420.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the embodiments as set forth in the following claims.

What is claimed is:

1. A semiconductor device, comprising:
   a substrate; and
   a doped hafnium oxide layer disposed on the substrate, the doped hafnium oxide layer including a hafnium oxide layer doped with doping atoms and having tetragonal unit lattices, an ion size of the doping atom being greater than an ion size of a hafnium atom.

2. The semiconductor device as claimed in claim 1, wherein the tetragonal unit lattices include a doped tetragonal unit lattice, and the doped tetragonal unit lattice includes hafnium atoms, oxygen atoms and the doping atom substituted for a hafnium atom on at least one lattice point.

3. The semiconductor device as claimed in claim 2, wherein the tetragonal unit lattices further include a pure tetragonal unit lattice consisting of hafnium atoms and oxygen atoms.

4. The semiconductor device as claimed in claim 1, wherein a dielectric constant of the doped hafnium oxide layer is about 32 to about 50.

5. The semiconductor device as claimed in claim 1, further comprising an undoped hafnium oxide layer disposed on the doped hafnium oxide layer, the undoped hafnium oxide layer being substantially free of the doping atoms.

6. The semiconductor device as claimed in claim 5, wherein the undoped hafnium oxide layer includes a pure tetragonal unit lattice consisting of hafnium atoms and oxygen atoms.

7. The semiconductor device as claimed in claim 1, wherein the doped atoms in the doped hafnium oxide layer have content ratios of about 3% to about 15%.

8. The semiconductor device as claimed in claim 1, further comprising an electrode disposed on the doped hafnium oxide layer.

9. The semiconductor device as claimed in claim 8, further comprising:
   a tunnel insulating layer disposed between the doped hafnium oxide layer and the substrate; and
   a charge storage layer disposed between the tunnel insulating layer and the doped hafnium oxide layer.

10. The semiconductor device as claimed in claim 8, further comprising a lower electrode disposed between the doped hafnium oxide layer and the substrate.

* * * * *